July 1, 1969 M. OFFNER ET AL 3,453,505

INTEGRATED COMPLEMENTARY TRANSISTOR CIRCUIT

Filed Jan. 18, 1967

United States Patent Office 3,453,505

Patented July 1, 1969

3,453,505

INTEGRATED COMPLEMENTARY TRANSISTOR CIRCUIT

Manfred Offner, Untermenzing, and Yuksel Yucelen, Munich, Germany, assignors to Siemens Aktiengesellschaft, a corporation of Germany Filed Jan. 18, 1967, Ser. No. 610,160
Claims priority, application Germany, Jan. 21, 1966, S 101,547
Int. Cl. H01l *11/06, 19/00*
U.S. Cl. 317—235 10 Claims

ABSTRACT OF THE DISCLOSURE

The integral semiconductor body of a current-limiting integrated transistor circuit comprises a stronger doped region of determined conductivity type and an adjacent weaker doped region of the determined conductivity type extending to the surface of the semiconductor body. Two spaced additional regions of a conductivity type opposite the determined conductivity type are provided in the weaker doped region and extend from the surface of the semiconductor body. A limited region of the determined conductivity type is provided in one of the additional regions and extends from the surface of the semiconductor body. The semiconductor body provides a voltage divider having a pair of series connected resistors connecting the base electrode of a first transistor to the collector electrode of a second transistor. The semiconductor body also provides a diode and a third resistor connected between the emitter electrode of the first transistor and a common point in the voltage divider between the series connected resistors. Also provided is a direct connection between the collector electrode of the first transistor and the base electrode of the second transistor.

BACKGROUND OF THE INVENTION

*Field of the invention*

The present invention relates to a current-limiting integrated transistor circuit.

The integrated circuit of the present invention is utilized in circuitry in which the current therethrough is limited to a practical, constant value within a determined voltage range. The integrated circuit of the present invention thus functions as a high dynamic resistance for alternating currents within such voltage range.

SUMMARY OF THE INVENTION

The principal object of the present invention is to provide a new and improved current-limiting integrated transistor circuit.

In accordance with the present invention, a current-limiting integrated transistor circuit comprises an integral semiconductor body having a surface, a stronger doped region of determined conductivity type, a weaker doped region of the determined conductivity type adjacent the stronger doped region, the weaker doped region extending to the surface of the semiconductor body, two spaced additional regions of a conductivity type opposite the determined conductivity type in the weaker doped region and extending from the surface of the semiconductor body, a limited region of the determined conductivity type in one of the additional regions and extending from the surface of the semiconductor body, an ohmic contact in electrical contact with the other of the additional regions and an ohmic contact in electrical contact with the limited region. The stronger doped region comprises a concentration of dopant which is about 10 times the concentration of dopant of the weaker doped region. The additional regions are spaced from each other a distance of approximately 10 microns and are spaced from the stronger doped region a distance of approximately 10 microns.

The integral semiconductor body provides a voltage divider comprising a pair of resistors connected to each other in series circuit arrangement and having a common point in the connection between them, a pair of complementary transistors, one of said transistors having a base electrode connected to a collector electrode of the other of said transistors via the series circuit arrangement, a diode and a third resistor connected in series circuit arrangement with each other between an emitter electrode of the one of said transistors and the common point of the voltage divider, a collector electrode of the one of the transistors being directly connected to a base electrode of the other of the transistors. The one of the transistors comprises one of the additional regions, the stronger doped region and the other of the additional regions, and the other of the transistors comprises the stronger doped region, the other of the additional regions and the limited region. A first of the pair of resistors of the voltage divider provided by the integral semiconductor body is connected to the base electrode of the one of the transistors and the second of the resistors is connected to the collector electrode of the other of the transistors, the ratio of the resistance of the first of the resistors to the second of the resistors being approximately 10. The resistance of the third resistor differs from the resistance of the second resistor by from 1 to 10 ohms and the resistance of the first resistor is from 100 to 1000 ohms.

In accordance with the present invention, a method of producing a current-limiting integrated transistor circuit comprises the steps of epitaxially growing on a stronger doped semiconductor body of determined conductivity type a weaker doped region of the same conductivity type, indiffusing doping material from a gaseous phase and of the opposite conductivity type from the determined conductivity type in two spaced additional regions of the weaker doped region to provide two spaced additional regions, and indiffusing doping material of the determined conductivity type in one of the additional regions to provide a limited region.

BRIEF DESCRIPTION OF THE DRAWING

In order that the present invention may be readily carried into effect, it will now be described with reference to the accompanying drawing, wherein.

DESCRIPTION OF THE PREFERRED EMBODIMENT

Figure 1:
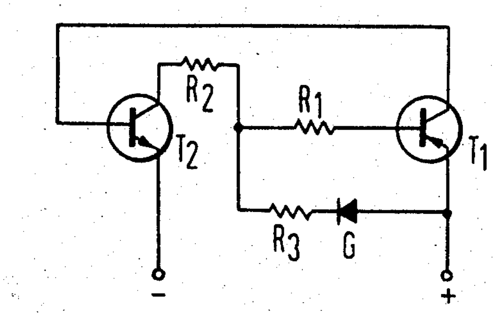
FIG. 1 is a circuit diagram of the integrated circuit of the present invention.

In FIG. 1, a first transistor $T_1$, shown as a pnp transistor, and a second transistor $T_2$, shown as an npn transistor, are complementary transistors. Each of the first and second transistors $T_1$ and $T_2$ has emitter, collector and base electrodes. The base electrode of the first transistor $T_1$ is connected to the collector electrode of the second transistor $T_2$ via two resistors $R_1$ and $R_2$ which are connected in series and which function as a voltage divider.

A common point in the connection between the resistors $R_1$ and $R_2$ is the center point of the voltage divider $R_1$, $R_2$ and is connected to the emitter electrode of the first transistor $T_1$ via a resistor $R_3$ and a diode G which are connected in series. The collector electrode of the first transistor $T_1$ is directly connected to the base electrode of the second transistor $T_2$. The positive input terminal + is connected to the emitter electrode of the first transistor $T_1$ and the negative input terminal — is connected to the emitter electrode of the second transistor $T_2$.

The resistance of the resistor $R_1$ is preferably larger than that of $R_2$ and the resistance of $R_3$ is preferably approximately equal to that of $R_2$. The ratio $R_1/R_2$ is preferably at least equal to 10. If, for example, $R_2$–$R_3$ is from 1 to 10 ohms and $R_1$ is from 100 to 1000 ohms in resistance, constant current is provided at a voltage of approximately 3 volts up to the breakdown voltage of the transistors.

A rising battery voltage would limit the base current of the first transistor $T_1$ and thereby its emitter and collector current. Since the collector current of the first transistor $T_1$ is equal to the base current of the second transistor $T_2$, its current is also limited. The circuit then acts as a transistor in the emitter circuit having a constant base current.

The integrated circuit of the present invention is an integrated, unitary semiconductor device comprising a semiconductor body or crystal in which a stronger doped region of one conductivity type is adjacent a weaker doped region of the same conductivity type, extending to the surface of the semiconductor body. There are two additional regions of the opposite conductivity type in the weaker doped region and extending from the surface of the semiconductor body. There is a limited region of the same conductivity type as the stronger doped region in one of the additional regions and extending from the surface of the semiconductor. The limited region is completely in the one additional region. The other additional region and the limited region are of opposite conductivity types and each is in electrical contact with an ohmic connection.

Figure 2:
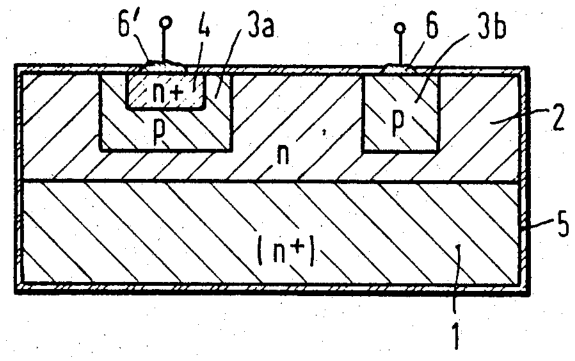
FIG. 2 is a sectional view of an embodiment of the integrated circuit of the present invention.

In FIG. 2, the stronger doped n conductivity type region 1 is adjacent the weaker doped n conductivity type region 2. The two additional p conductivity type regions 3*a* and 3*b* extend from the surface of the semiconductor body into the weaker doped region 2. The limited n conductivity type region 4 extends from the surface of the semiconductor body into the additional region 3*a*. An ohmic connection or contact 6 is in electrical contact with the additional region 3*b*. An ohmic connection 6' is in electrical contact with the limited region 4. The outer surfaces of the semiconductor crystal are preferably provided with a protective layer 5. The protective layer 5 may comprise, for example, silicon dioxide or $SiO_2$.

The production of the integrated circuit of the present invention preferably commences with a semiconductor base crystal of the same conductivity type as the stronger doped region 1. The region 2 is epitaxially applied to the region 1, preferably from the gaseous phase. When the region 2 is doped, it must be considered that said region constitutes the base for one of the complementary transistors and is the collector region for the other of said complementary transistors. The two additional regions 3*a* and 3*b* are then produced in the epitactic region 2 by diffusion processes, preferably by the known planar technique. Details concerning a suitable technique may be found in pertinent reference material such as, for example in U.S. Patent No. 3,064,167. The limited region 4 is then formed by indiffusing dopant material of the same conductivity type as the stronger doped region 1.

The distance between the additional regions 3*a* and 3*b* and between each of the additional regions 3*a* and 3*b* and the stronger doped region 1 is approximately 10 microns and is preferably less than 10 microns. The depth of each of the additional regions is from 3 to 6 microns. The dimensions of the limited region 4 are determined by the transistors.

In the illustrated example, the regions 1, 2 and 4 are of n conductivity type and the regions 3*a* and 3*b* are of p conductivity type. The regions 3*a*, 2 and 3*b* form the first transistor $T_1$ (FIG. 1) of the integrated circuit, which is a pnp transistor. The regions 2, 3*a* and 4 form the second transistor $T_2$ (FIG. 1) of the integrated circuit, which is of npn type. The other components of the circuit of FIG. 1 are implicitly included in the integrated circuit of FIG. 2.

If, in accordance with the present invention, the conductivity of the weaker doped region 2 is adjusted to be so weak compared to the conductivity of the stronger doped region 1 of the same conductivity type that a considerable portion, possibly even the larger portion of the current flowing between the additional regions 3*a* and 3*b*, flows through the region 1, then the series connection of the regions 3*b*, 2, 1, 2 and 3*a* comprises the series connection of the diode G with the resistor $R_2$ and the resistor $R_3$, while the portion of the current flowing through the region 2 flows through the series connection of the resistors $R_1$ and $R_2$. The integrated semiconductor device of FIG. 2 provides the integrated circuit of FIG. 1.

Since the two additional regions 3*a* and 3*b*, together with the portion of the weaker doped region 2 between them, form a pnp transistor, the distance between the regions 3*a* and 3*b* should not be too great. Although for different reasons, the distance between the regions 3*b* and 1 should also not be too great. In both cases, about 10 microns is preferably the determining factor.

The region 2, together with the region 3*a* and the region 4, form a npn transistor. This, however, is a conventional known planar structure of a npn transistor having optinum dimensions and doping ratios which are well known and need not be further disclosed. This also applies to the analogous device in which each region is of a conductivity type opposite that of the corresponding region of the integrated semiconductor device of FIG. 2.

When the doping intensity, density or concentration of the stronger doped region 1 is approximately 10 times that of the weaker doped region 2, favorable conditions were obtained.

While the invention has been described by means of a specific example and in a specific embodiment, we do not wish to be limited thereto, for obvious modifications will occur to those skilled in the art without departing from the spirit and scope of the invention.

What we claim is:

1. A current-limiting integrated transistor circuit, comprising an integral semiconductor body having a surface, a first doped region of determined conductivity type, a second doped region of said determined conductivity type adjacent said first doped region, said second region being more weakly doped than said first region, said second doped region extending to the surface of said semiconductor body, two spaced additional regions of a conductivity type opposite said determined conductivity type in said second doped region and extending from the surface of said semiconductor body, a limited region of said determined conductivity type in one of said additional regions and extending from the surface of said semiconductor body, an ohmic contact in electrical contact with the other of said additional regions and an ohmic contact in electrical contact with said limited region, said limited region, said one of said additional regions and said second doped region constituting a transistor and said one of said additional regions, said second doped region and the other of said additional regions constituting a complementary transistor.

2. A current-limiting integrated transistor circuit as claimed in claim 1, wherein said first doped region comprises a concentration of dopant which is about 10 times the concentration of dopant of said second doped region.

3. A current-limiting integrated transistor circuit as claimed in claim 1, wherein said additional regions are spaced from each other a distance of approximately 10 microns.

4. A current-limiting integrated transistor circuit as claimed in claim 1, wherein said additional regions are spaced from said first doped region a distance of approximately 10 microns.

5. A current limiting integrated transistor circuit as claimed in claim 1, wherein said integral semiconductor body provides a voltage divider comprising a pair of resistors connected to each other in series circuit arrangement and having a common point in the connection between them, and said regions constitute a pair of complementary transistors, one of said transistors having a base electrode connected to a collector electrode of the other of said transistors via said series circuit arrangement, a diode and a third resistor connected in series circuit arrangement with each other between an emitter electrode of said one of said transistors and the common point of said voltage divider, a collector electrode of said one of said transistors being directly connected to a base electrode of said other of said transistors.

6. A current-limiting integrated transistor circuit as claimed in claim 2, wherein said additional regions are spaced from each other and from said first doped region a distance of approximately 10 microns.

7. A current-limiting integrated transistor circuit as claimed in claim 5, wherein said one of said transistors comprises one of said additional regions, said second doped region and the other of said additional regions and said other of said transistors comprises said second doped region, the other of said additional regions and said limited region.

8. A current-limiting integrated transistor circuit as claimed in claim 5, wherein a first of the pair of resistors of the voltage divider provided by said integral semiconductor body is connected to the base electrode of said one of said transistors and the second of said resistors is connected to the collector electrode of the other of said transistors, the ratio of the resistance of said first of said resistors to said second of said resistors being approximately 10.

9. A current-limiting integrated transistor circuit as claimed in claim 8, wherein the resistance of said third resistor differs from the resistance of said second resistor by from 1 to 10 ohms and the resistance of said first resistor is from 100 to 1000 ohms.

10. A current-limiting integrated transistor circuit as claimed in claim 9, wherein said one of said transistors comprises one of said additional regions, said second doped region and the other of said additional regions, and said other of said transistors comprises said second doped region, the other of said additional regions and said limited region.

References Cited

UNITED STATES PATENTS

| | | | |
|---|---|---|---|
| 3,265,905 | 8/1966 | McNeil | 307—88.5 |
| 3,335,340 | 8/1967 | Barson | 317—235 |
| 3,178,804 | 4/1965 | Ullery | 29—155.5 |

JOHN W. HUCKERT, *Primary Examiner.*

M. H. EDLOW, *Assistant Examiner.*

U.S. Cl. X.R.

307—237, 288, 303; 317—234